(12) United States Patent  
Grabmaier

(10) Patent No.: US 9,057,936 B2
(45) Date of Patent: Jun. 16, 2015

(54) MICROMECHANICAL PROJECTION DEVICE AND METHOD FOR MANUFACTURING A MICROMECHANICAL PROJECTION DEVICE

(75) Inventor: Florian Grabmaier, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 246 days.

(21) Appl. No.: 13/501,983

(22) PCT Filed: Oct. 20, 2010

(86) PCT No.: PCT/EP2010/065798
§ 371 (c)(1),
(2), (4) Date: Jun. 26, 2012

(87) PCT Pub. No.: WO2011/048146
PCT Pub. Date: Apr. 28, 2011

(65) Prior Publication Data
US 2012/0262681 A1    Oct. 18, 2012

(30) Foreign Application Priority Data

Oct. 22, 2009  (DE) .......................... 10 2009 045 919

(51) Int. Cl.
*G03B 21/14* (2006.01)
*H04N 9/31* (2006.01)

(52) U.S. Cl.
CPC ........... *G03B 21/14* (2013.01); *Y10T 29/49002* (2015.01); *G03B 21/145* (2013.01); *H04N 9/3141* (2013.01); *H04N 9/31* (2013.01); *H04N 9/3173* (2013.01)

(58) Field of Classification Search
CPC .... H04N 9/3141; G03B 21/00; G03B 21/146; H05K 3/365; H05K 7/1069
USPC ........... 353/119, 122; 248/693, 160; 362/555; 439/67, 68, 329, 447
See application file for complete search history.

(56) References Cited

U.S. PATENT DOCUMENTS

| 6,485,146 B2 * | 11/2002 | Rodriguez, Jr. ................. 353/79 |
| 8,562,149 B2 * | 10/2013 | Hu et al. ......................... 353/85 |
| 2002/0067533 A1 | 6/2002 | Sun et al. |
| 2004/0246555 A1 | 12/2004 | Kohl et al. |
| 2005/0056701 A1 | 3/2005 | Swartz et al. |
| 2005/0243404 A1 | 11/2005 | Knipe |
| 2006/0261457 A1 * | 11/2006 | Rancuret et al. .............. 257/679 |

(Continued)

FOREIGN PATENT DOCUMENTS

| CN | 1242556 | 1/2000 |
| CN | 101687630 | 3/2010 |

(Continued)

OTHER PUBLICATIONS

International Search Report for PCT/EP2010/065798, dated Feb. 21, 2011.

*Primary Examiner* — William C Dowling
*Assistant Examiner* — Ryan Howard
(74) *Attorney, Agent, or Firm* — Kenyon & Kenyon LLP

(57) ABSTRACT

A micromechanical projection device includes: a carrier which has a first, a second, and a third section, the second section being situated between the first and the third sections and having a flexible design; a mirror, which is mounted on the first section; and a light source which is mounted on the third section. The second section is bent in such a way that a light beam from the light source is directable onto the mirror.

7 Claims, 3 Drawing Sheets

(56) References Cited

U.S. PATENT DOCUMENTS

2009/0231932 A1 * 9/2009 Huffman et al. ......... 365/189.11

FOREIGN PATENT DOCUMENTS

| | | |
|---|---|---|
| DE | 602 04 343 | 1/2006 |
| EP | 1488103 | 12/2008 |
| JP | 2002-250886 | 9/2002 |
| JP | 2003-295069 | 10/2003 |
| JP | 2008-20540 | 1/2008 |
| TW | 200529584 | 11/2005 |
| TW | 200802140 | 1/2008 |
| WO | WO 2009002523 | 12/2004 |

* cited by examiner

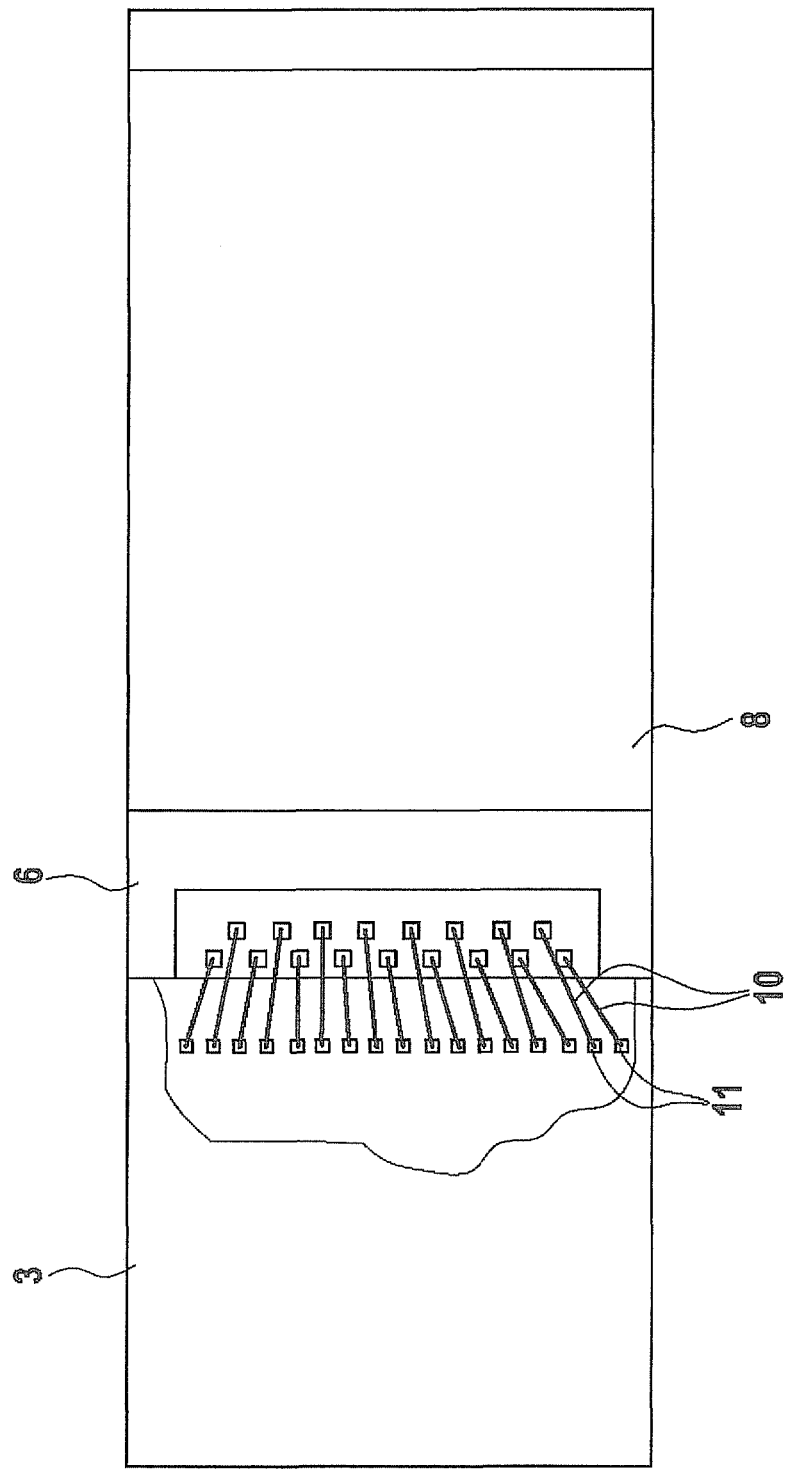

MICROMECHANICAL PROJECTION DEVICE AND METHOD FOR MANUFACTURING A MICROMECHANICAL PROJECTION DEVICE

BACKGROUND OF THE INVENTION

1. Field of the Invention

The present invention relates to a micromechanical projection device and a method for manufacturing a micromechanical projection device.

2. Description of Related Art

Such a micromechanical projection device may be used, for example, in a hand-held device, such as a bar code scanner or a mobile phone, to generate an image on a projection surface outside the device. A micromechanical projection device of this type is described in published German patent application document DE 602 04 343 T2, for example.

A micromechanical projection device known internally to the applicant has an adjustable mirror and a laser light source which are accommodated in a die cast aluminum housing. The mirror in the form of a micromechanical chip is positioned in relation to the laser light source in such a way that a laser light beam generated by the laser light source strikes the mirror and is projected through a window of the die cast aluminum housing onto a projection surface.

For the purpose of positioning of the mirror and the laser light source to one another, the die cast aluminum housing is provided with special recesses in its interior. The mirror and the laser light source are fixed in these recesses. The mirror and the laser light source are electrically connected to a control electronics via wires.

BRIEF SUMMARY OF THE INVENTION

The micromechanical projection device according to the present invention and the method for manufacturing the micromechanical projection device according to the present invention have the advantage over the conventional approaches in that the initially flat carrier may be easily equipped with the mirror and the light source during assembly. For this purpose, a simple gantry robot is suitable, for example. Subsequently, the second section may be bent to obtain the desired position of the light source relative to the mirror. Furthermore, it is thus possible to carry out the labor-intensive equipping of the carrier at a first location. The subsequent bending of the second section for the purpose of exact positioning of the light source and the mirror to one another may take place at a second location where this relatively difficult process is mastered, or appropriate tools are available to be able to carry out the exact positioning.

In the present case, "micromechanical projection device" is understood to mean a projection device having micromechanical components.

According to one preferred refinement of the present invention, the electronic and/or electromechanical components of the micromechanical projection device, in particular of the mirror and/or the light source, are checked for their functionality after mounting these on the carrier, but prior to bending the second section. This has the advantage that only functioning carriers including electronic and/or electromechanical components are subjected to the complex bending process. Malfunctioning carriers and components, due to erroneous solder joints, for example, may thus be rejected at an early stage without investing futile effort.

According to one preferred refinement of the present invention, the electronic and/or electromechanical components of the micromechanical projection device are electrically operated during the bending. "Electrically operated" is understood in particular to mean that the light source generates the light beam. This facilitates the exact positioning of the light source in relation to the mirror.

BRIEF DESCRIPTION OF THE DRAWINGS

FIG. 3 shows a view A from FIG. 1 in an enlarged representation.

DETAILED DESCRIPTION OF THE INVENTION

Figure 1:
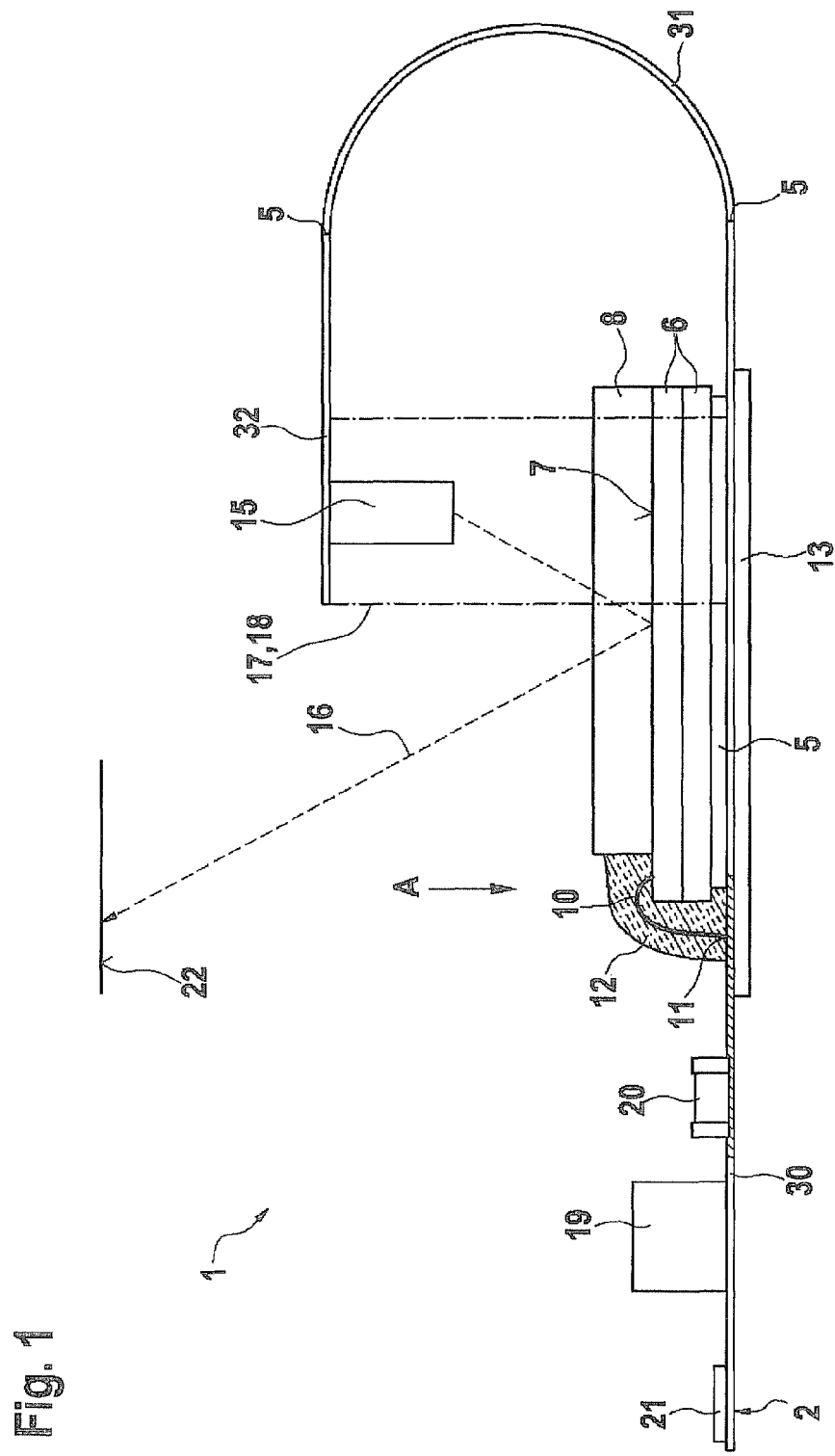
FIG. 1 shows a side view of a micromechanical projection device according to one exemplary embodiment of the present invention.

In the figures, identical reference numerals identify identical components or components having an identical function, unless otherwise indicated.

Figure 2:
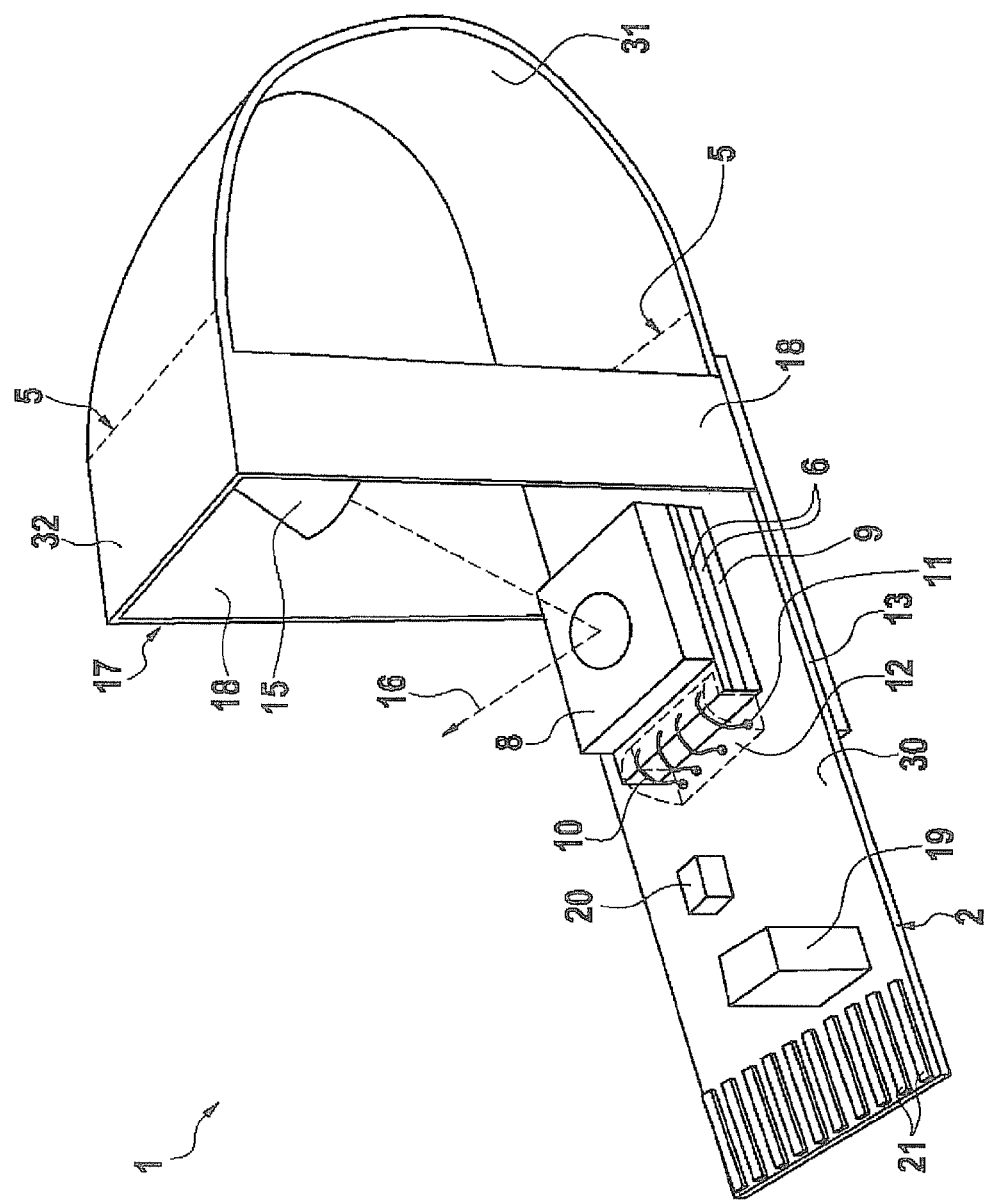
FIG. 2 shows a perspective view of the micromechanical projection device from FIG. 1.

FIG. 1 shows a side view of a micromechanical projection device 1 according to one exemplary embodiment of the present invention, and FIG. 2 shows a perspective view of projection device 1.

Projection device 1 has a carrier 2. Carrier 2 includes an essentially flat first section 30, a bent second section 31, and an essentially flat third section 32. According to the present exemplary embodiment, three sections 30, 31, 32 are designed from one piece of flexible printed board (FPB). It is, however, conceivable to manufacture the three sections 30, 31, 32 from different pieces of material, i.e., from one flexible printed board and two rigid printed boards, for example, and to join them in areas 5. In this case, only second section 31 would be manufactured from a flexible material.

A mirror 6, whose reflection surface 7 is adjustable, is mounted on first section 30. Mirror 6 is preferably designed in the form of a micromechanical chip (for example a MEMS chip). Mirror 6 may be provided with a glass layer 8 protecting it on one of its sides. On its other side, mirror 6 may be mounted on a control chip 9, for example an ASIC chip. Control chip 9 preferably controls, inter alia, the adjusting of reflection surface 7 and a light source which will be elucidated in greater detail below. Mirror 6 is preferably provided with bonding wires 10, which may also be seen in FIG. 3, showing a view A from FIG. 1. Bonding wires 10 contact mirror 6 with the aid of contacts 11 of conductors (not illustrated) of first section 30. To make contacts 11 visible, first section 30 is shown partially sectioned. A glob-top passivation 12 is applied to bonding wires 10. Control chip 9 is preferably mounted on first section 30 with the aid of a flip-chip technique.

Alternatively, mirror 6 and control chip 9 may also be mounted next to one another on first section 30. Furthermore, mirror 6 may also be mounted on control chip 9 with the aid of a flip-chip technique. In this case, the elucidated contacting with the aid of bonding wires 10 may be dispensed with.

A reinforcing element 13 is preferably mounted on the side of first section 30 facing away from mirror 6 and essentially opposite mirror 6. Reinforcing element 13 reinforces section 30 to reduce the mechanical stress on control chip 9. In particular, reinforcement 13 thus counteracts the bending forces resulting from the bending of second section 31. Reinforcement 13 may include, for example, metal, in particular aluminum or stainless steel, or plastic.

Third section 32 has a light source 15 which is designed in the form of a laser light source according to the present exemplary embodiment. Light source 15 is positioned in such a way that a light beam 16 generated thereby strikes reflection surface 7 of mirror 6. For this purpose, second section 31 has an approximately semicircular shape. Alternatively, it could be U shaped or simply L shaped, or have a shape in-between. A driver, which controls light source 15, may be integrated into control chip 9.

Third section 32 is held in position in relation to first section 30 with the aid of a holding means 17. Holding means 17 is indicated in FIG. 1 with the aid of a dash-and-dot line. Holding means 17 preferably consists of two holding segments 18, each of which connects third section 32 to first section 30 in the area of reinforcing element 13, as is apparent from FIG. 2. Holding segments 18 are preferably each fastened, in particular glued, to the opposite narrow sides of sections 30 and 32.

Moreover, additional electrical components, such as a transformer 19 and a capacitor 20, may be mounted on first section 30. Furthermore, connections 21, e.g., on the free end of first section 30, may be provided with the aid of which projection device 1 is electrically connectable to other devices.

In the case of the present exemplary embodiment, in which sections 30, 31, 32 are designed in the form of printed boards, all electrical components 6, 9, 15, 19, 20, 21 are obviously electrically connected, in particular soldered, to conductors (not illustrated) of first, second and third sections 30, 31, 32, even though this has not been previously explicitly described.

The operating principle of projection device 1 is briefly described below.

Light source 15 generates light beam 16 which strikes reflection surface 7 of mirror 6 and which is projected therefrom onto a projection surface 22. Control chip 9 controls mirror 6, the mirror adjusting its reflection surface 7. This takes place as a function of signals which are coupled into control chip 9 via connections 21, for example. Due to adjustment of the reflection surface 7 and the movement of light beam 16 associated therewith, an image is generated on projection surface 22.

Finally, a method for manufacturing projection device 1 is described.

In a first step, initially essentially flat carrier 2 is made available.

In a second step, reinforcing element 13 may be mounted, in particular glued, on the underside of first section 30 of carrier 2.

In a third step, electrical and electromechanical components 9, 15, 19, 20, 21 and 6 are positioned and electrically connected on the top side of particular sections 30 and 32 of carrier 2, e.g., with the aid of a gantry robot (not illustrated). According to the present exemplary embodiment, control chip 9 is initially mounted on first section 30 with the aid of a flip-chip technique. After that (or at the same time, or before that) transformer 19, capacitor 20, connections 21 as well as any other not-described electrical components may be mounted on first section 30. Light source 15 is furthermore mounted on third section 32. After that, mirror 6 is stacked on control chip 9 and is connected to contacts 11 of first section 30 with the aid of contact wires 10. Subsequently, free contact wires 10 are glob-top molded.

The manufactured intermediate product, i.e., carrier 2 including electrical and electromechanical components 9, 15, 19, 20, 21 and 6, is checked for functionality in a fourth step. A suitable testing device (not illustrated) may be connected to connections 21 and perform certain tests. Intermediate products, which have defects, may thus be recognized and rejected.

Steps one through four are preferably carried out at a first location, since they are relatively labor-intensive. The checked intermediate product is then shipped to a second location where the subsequent steps, which require a certain amount of expertise, are carried out.

In a fifth step, second section 31 is bent approximately semicircularly, preferably with the aid of a bending device (not illustrated). During the bending process, electrical and electromechanical components 9, 15, 19, 20, 21 and 6 are preferably switched for operation. In particular, light source 15 should be switched in such a way that it generates a light beam 16. If second section 31 is bent far enough, light beam 16 strikes reflection surface 7 of mirror 6 and is projected therefrom onto projection surface 22. Preferably, a measuring device (not illustrated) measures the position of light beam 16 on projection surface 22 and outputs appropriate signals to the bending device which bends second section 31 as a function of these signals in such a way that an ideal position of light source 15 may be found depending on the requirements.

In a sixth step, third section 32 is connected to first section 30. For this purpose, holding segments 18 of previously manufactured holding means 17 are connected to sections 30 and 32. Holding means 17 may, for example, be made of a plastic which is preferably manufactured in an injection-molding process.

Holding means 17 may also be designed in the form of a housing of a device (not illustrated), into which projection device 1 may be integrated. Components could be conserved in this way.

The advantageous embodiments described for projection device 1 may be used for the method for manufacturing projection device 1 and vice versa.

What is claimed is:

1. A micromechanical projection device, comprising:
a carrier having a first section, a second section, and a third section, wherein the second section is flexible, electrically connected to the first and third sections, and situated between the first and third sections;
a mirror mounted on the first section; and
a light source mounted on the third section;
wherein at least the second section is in the form of a flexible printed board and the second section is bent in such a way that a light beam from the light source is directed onto the mirror.

2. The micromechanical projection device as recited in claim 1, wherein the second section is bent in one of approximately semicircular shape, U shape or L shape.

3. The micromechanical projection device as recited in claim 1, further comprising:
a holding unit which holds at least one of the bent second section and the third section in position relative to the first section.

4. The micromechanical projection device as recited in claim 1, further comprising:
a control chip which controls at least one of the light source and the mirror, wherein the mirror is in the form of a micromechanical chip, and wherein the control chip is situated between the first section and the mirror.

5. A method for manufacturing a micromechanical projection device, comprising:
providing an essentially flat carrier having a first section, a second section, and a third section, wherein the second section is a flexible printed board, electrically connected to the first and third sections, and situated between the first and third sections;
mounting a mirror on the first section of the carrier;

mounting a light source on the third section of the carrier; and bending the second section of the carrier in such a way that a light beam from the light source is directed onto the mirror.

6. A method for manufacturing a micromechanical projection device, comprising:

provide an essentially flat carrier having a first section, a second section, and a third section, wherein the second section is flexible and situated between the first and the third sections;

mounting a mirror on the first section of the carrier;

mounting a light source on the third section of the carrier;

bending the second section of the carrier in such a way that a light beam from the light source is directed onto the mirror; and checking the functionality of at least one of the mirror and the light source after mounting the at least one of the mirror and the light source on the carrier, but prior to bending the second section.

7. A method for manufacturing a micromechanical projection device, comprising:

providing an essentially flat carrier having a first section, a second section, and a third section, wherein the second section is flexible and situated between the first and the third sections;

mounting a mirror on the first section of the carrier;

mounting a light source on the third section of the carrier;

bending the second section of the carrier in such a way that a light beam from the light source is directed onto the mirror; and electrically operating at least one of the mirror and the light source during the bending process after mounting the at least one of the mirror and the light source on the carrier.

* * * * *